United States Patent [19]

Hoerschelmann et al.

[11] 4,434,036
[45] Feb. 28, 1984

[54] METHOD AND APPARATUS FOR DOPING SEMICONDUCTOR MATERIAL

[75] Inventors: Konstantin Hoerschelmann; Helmold Kausche, both of Munich; Werner Späth, Holzkirchen, all of Fed. Rep. of Germany

[73] Assignee: Siemens Aktiengesellschaft, Berlin and Munich, Fed. Rep. of Germany

[21] Appl. No.: 374,415

[22] Filed: May 3, 1982

[30] Foreign Application Priority Data

May 12, 1981 [DE] Fed. Rep. of Germany ....... 3118785

[51] Int. Cl.³ ...................... H01L 21/22; H01J 17/00
[52] U.S. Cl. ..................................... 204/164; 148/189
[58] Field of Search ......................... 204/164; 148/189

[56] References Cited

U.S. PATENT DOCUMENTS

| | | | |
|---|---|---|---|
| 3,090,745 | 5/1963 | Berghaus | 204/164 X |
| 3,337,438 | 8/1967 | Gobeli et al. | 204/164 |
| 3,424,661 | 1/1969 | Androshuk et al. | 204/164 |
| 3,738,828 | 6/1973 | Inoue | 419/30 |
| 3,908,183 | 9/1975 | Ennis | 148/189 X |
| 3,960,605 | 6/1976 | Beck et al. | 148/1.5 |
| 3,997,379 | 12/1976 | Rosnowski | 148/189 |

OTHER PUBLICATIONS

Vossen, J. Electrochem. Soc., vol. 126, No. 2, pp. 319-322, 2/79.

*Primary Examiner*—F. Edmundson
*Attorney, Agent, or Firm*—Herbert L. Lerner; Laurence A. Greenberg

[57] ABSTRACT

Method for doping semiconductor material, including a container into which doping material is led and aimed at the semiconductor material by means of an electrical field, which includes maintaining the doping material in a plasma in the container, and leading doping material ions into the semiconductor material by means of the electrical field, and an apparatus for carrying out the method.

16 Claims, 6 Drawing Figures

METHOD AND APPARATUS FOR DOPING SEMICONDUCTOR MATERIAL

The invention relates to a method for the doping of semiconductor material, where the dopant or doping material is fed into a container and there is aimed at the semiconductor material by means of an electrical field; the invention further relates to a device for carrying out the method on a semiconductor component, which is doped by such a method or such a device, respectively.

The fabrication of semiconductor components is usually initiated by feeding individual areas of the opposite conductivity type into a semiconductor substrate of a specified conductivity type by doping means. For this doping requirement, gas diffusion processes, ion implementation, paint-on methods, i.e., dopings of glassy material or liquid applications, respectively, are customarily used. All of these known processes which are for surface level, low-ohmic dopings such as are used for pn-junctions in solar cells, or for the rear side of low-contact resistors, are relatively expensive.

It is accordingly an object of the invention to provide a method and device for the doping of semiconductor material, which overcomes the hereinafore-mentioned shortcomings of the heretofore-known methods and devices of this general type, and which is effective with a minimal technical input and thus is suitable for mass production, particularly for solar cells.

With the foregoing and other objects in view there is provided, in accordance with the invention, a method for doping semiconductor material, including a container into which doping material is led and aimed at the semiconductor material by means of an electric field, which comprises maintaining the doping material in a plamsa in the container, and leading doping material ions into the semiconductor material by means of the electrical field.

In accordance with another mode of the invention, there is provided a method which comprises providing the plasma in the form of a capacitively coupled-in high-frequency plasma.

In accordance with a further mode of the invention, there is provided a method which comprises providing the plasma in the form of an inductively excited high-frequency plasma.

In accordance with an added mode of the invention, there is provided a method which comprises separately controlling the electromagnetic field for plasma generation and for forming a strain voltage, tractive force or tensile stress, for accelerating ions onto a target. In this way the voltage and current can be set independently of each other within certain limits, according to the required extent of doping and assembly.

In accordance with an additional mode of the invention, there is provided a method which comprises generating the plasma in the form of a capacitively or an inductively excited high-frequency plasma in a doping gas, accelerating the doping material ions onto a target on which the semiconductor material to be doped is provided, and providing the semiconductor material in the form of a semiconductor substrate. These semiconductor substrates can be applied to the target in a flat or upright clamped position.

In accordance with again another mode of the invention, there is provided a method which comprises providing the doping gas from the group consisting of $PH_3$, $B_2H_6$ and phosphoric vapor, from an evaporator source.

In accordance with again a further mode of the invention, there is provided a method which comprises providing the tank in the form of a glass receptacle, placing a high-frequency coil with a frequency of substantially 4 MHz around the receptacle, and exciting a low-pressure plasma or ring discharge of substantially $8 \times 10^{-4}$ torr in a hydrogen-phosphine mixture or compound with the coil.

In accordance with again an added feature of the invention, there is provided a method which comprises applying a strain voltage or tractive force of substantially 500 volts between or across a target and an anode for several seconds.

In accordance with again an additional mode of the invention, there is provided a method which comprises maintaining a current density on a target of substantially 1 mA/cm$^2$. Through the high current density of approximately 1 mA/cm$^2$, even during this brief period, a maximal doping of about $10^{22}$ impurity concentration atoms/cm$^3$ at an attenuation distance of about $5 \times 10^{-3}$ μm (50 Å) was accomplished without any noticeably accompanying detachment or sputtering off, respectively, of target material. In accordance with yet another mode of the invention, there is provided a method which comprises slowly upwardly controlling the strain voltage or tractive force to reduce the maximal doping level in the semiconductor material and to obtain an optimal output doping profile. By slowly controlling a rise in voltage, the doping maximum can be reduced because in this way a flatter doping concentration profile is developed and thus any danger of precipitations is reduced. Following this low-energetic ion implantation, in accordance with yet a further mode of the invention, there is provided a method which comprises curing the semiconductor material, e.g. $SiO_2$, with or without a cover at substantially 950° C. for substantially 30 minutes, and forming the desired doping profile by diffusion.

Based on the invention, a semiconductor component is produced by the method comprising a semiconductor substrate and a layer disposed on the substrate having a layer resistance of substantially 30 Ω/□ with a depth of penetration or attenuation of substantially 0.3 μm, corresponding to a doping of substantially $5 \times 10^{15}$ cm$^{-2}$.

Instead of a thermal curing, in accordance with yet an added mode of the invention, there is provided a method which comprises curing the semiconductor material by bombardment with a laser or an electron beam.

The invention facilitates a doping of large-size target faces with extremely reduced doping times so that the substrate throughput is limited only by the equipment setup of the device. For example, 600 to 1000 4-inch silicon disks, that is disks having a diameter of about 10 cm, can be processed hourly with presently known sputtering systems after converting them to the doping method described above.

Because of the low working pressure employed, only a minor undermask diffusion must be taken into account, which allows a partial doping of substrates. For example, for the fabrication of solar cells the edge of the disks can be screened off with a ring mask.

A major advantage of the invention resides in the simple assembly of the device for implementing the method according to the invention and in the related reduced doping costs.

Furthermore, with an inductively excited plasma, by contrast with a high frequency diode or capacitively excited plasma, respectively, no anodic ion bombardment occurs, which reduces the contamination danger posed by residual gases even more so.

In accordance with the apparatus of the invention there is provided a device for implementing a method for doping semiconductor material, comprising a container, a high-frequency plasma including doping material disposed in the container, and a high-frequency coil disposed around the container providing an electric field for inductively activating or generating the high-frequency plasma and leading doping material ions into the semiconductor material in the container.

In accordance with another feature of the invention, there is provided a titanium target disposed in the container.

In accordance with a further feature of the invention, there is provided a rotary magazine in the container for consecutively processing through a plurality of semiconductor substrates.

In accordance with an added feature of the invention, a chamber is formed in the container for the plasma, and including at least one lock or sluice connected to the container for charging semiconductor substrates into the plasma chamber without contamination.

In accordance with an additional feature of the invention, there is provided a supply magazine insertible into the lock.

In accordance with again another feature of the invention, there is provided a target disposed in the container, the semiconductor material being in the form of semiconductor substrates vertically disposed on the target edgewise.

In accordance with again a further feature of the invention, there is provided a target disposed in the container, the semiconductor material being in the form of semiconductor substrates disposed parallel to the target.

Other features which are considered as characteristic for the invention are set forth in the appended claims.

Although the invention is illustrated and described herein as embodied in a method and device for the doping of semiconductor material, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which.

Figure 1:
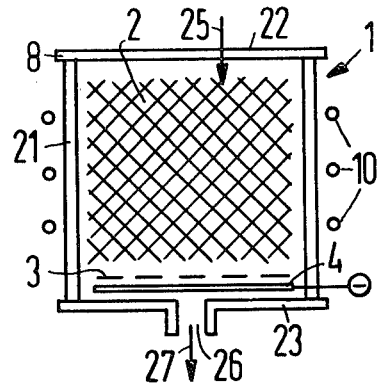
FIG. 1 is a diagrammatic elevational view of a device for implementing the method according to the invention in a simple assembly.

Referring now to the figures of the drawing and first particularly to FIG. 1 thereof, there is seen a simply assembled device for implementing the method according to the invention. In a tank or container 1, having a glass cylinder 21, a cover 22, and a bottom 23, a plasma 2 is inductively excited by a high frequency coil 10, which is coiled around the cylinder 21. A voltage of about 500 volts is applied across the cover 22, which is electrically insulated against the bottom 23, and a target 4. In this case the target 4 is connected to the negative pole of a voltage source disposed outside the tank 1, through a non-illustrated electrical feed-through duct or insulator. Phosphine ($PH_3$ in $H_2$), phosphoric vapor or Diboran in $H_2$ is administered into the interior of tank 1 through an inlet in the cover 22 is diagrammatically indicated by an arrow 25, and is in turn evacuated through an opening 26 in the bottom 23, as indicated by an arrow 27.

With this embodiment example, the high frequency coil 10 excites the plasma 2 in the interior of the tank 1. This plasma contains the phosphine administered through the inlet 25. By means of the accelerating voltage placed between the anode-connected cover 22 and the target 4, the doping material ions are forced from the plasma 2 onto semiconductor substrates 3, which lie on the target 4. The target 4 preferably is formed of titanium.

Figure 2:
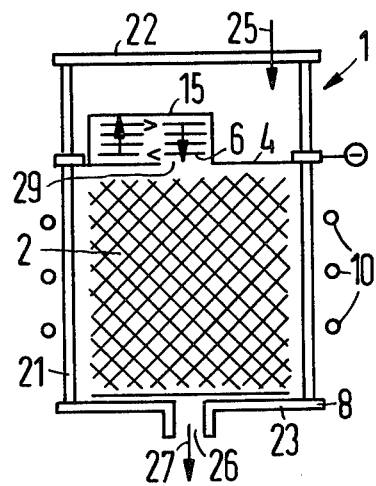
FIG. 2 is another diagrammatic elevational view of a device for implementing the method according to the invention with a rotary magazine, so that several processes can be carried out consecutively.

FIG. 2 shows another embodiment example of the invention, in which the target 4 has an opening 29 formed therein, which leads to a rotary magazine 15, through which individual substrate disks 6 can be consecutively exposed to the doping material or dopant from the plasma 2.

In this way several doping processes can be consecutively conducted on a plurality of disks. With this embodiment example the bottom 23 serves as an anode; the bottom is moreover electrically insulated from the target 4.

Figure 3:
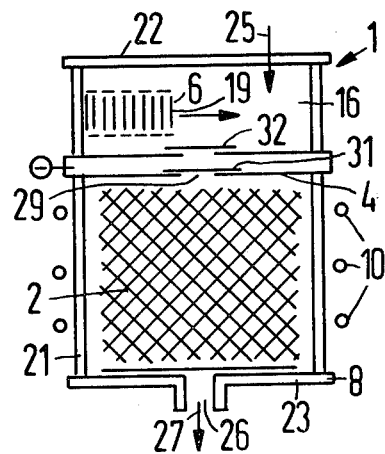
FIG. 3 is a view similar to FIG. 2 of a device for implementing the method according to the invention with a lock for charging and discharging semiconductor substrates without contaminating the plasma chamber.

FIG. 3 shows a further embodiment example of the invention, in which similarly to the embodiment of FIG. 2, the target has an opening 29 formed therein. However, above this opening 29 a valve cover 31 is found, through which the interior of the tank 1 with the plasma 2 can be sealed off against the upper part. Behind this opening 29 there is a coating position 32, into which individual semiconductor substrates 6 from a supply magazine 19 can be consecutively brought. By means of this embodiment example charging and discharging of individual semiconductor substrates 6 is possible without contaminating the plasma chamber itself, that is the interior of the container or tank 1.

Figure 4:
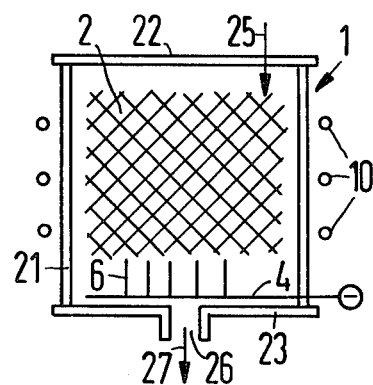
FIG. 4 is a view similar to FIG. 1 of a device for implementing the method according to the invention, through which semiconductor substrates are doped all around.

Shown in FIG. 4 is an embodiment example, in which individual semiconductor substrates 6 are disposed upright or on edge on the target 4. With this embodiment, an all around doping of individual semiconductor substrates is possible.

Figure 5:
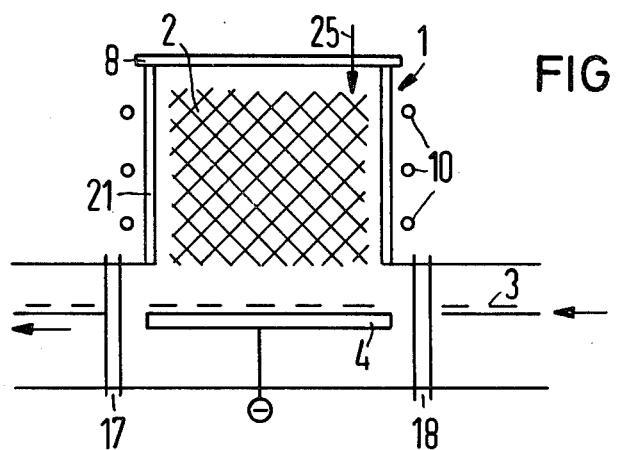
FIG. 5 is a further diagrammatic elevational view of a device for implementing the method according to the invention, with a lock system, through which the semiconductor substrates are able to be consecutively doped.

In FIG. 5 a further embodiment example having a lock system is shown, in which on the left and right of the target 4 a lock 17, 18, respectively, is shown, through which the individual semiconductor materials 3 are consecutively brought to the target 4.

Figure 6:
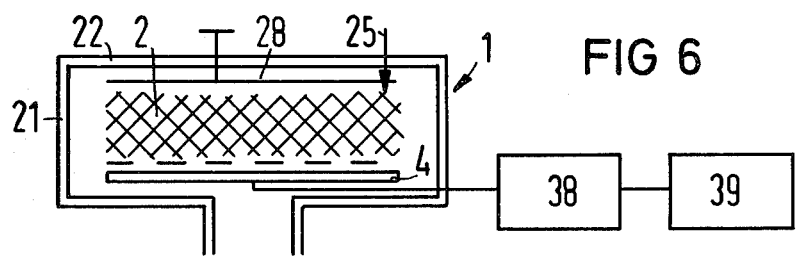
FIG. 6 is yet another elevational view of a device for implementing the method according to the invention with a plasma capacitively coupled in by a high frequency diode.

Finally, FIG. 6 shows an embodiment example of the type wherein the plasma 2 is capacitively excited, in which an isolated capacitor 4, 28 is provided. In this case the target 4 simultaneously serves as a capacitor plate. Furthermore, the target 4 is connected to a high frequency transmitter 39 by an adapter or tuning device 38. This high frequency transmitter 39 generates the energy required for exciting the plasma 2 in the tank or container 1.

The foregoing is a description corresponding to German Application No. P 31 18 785.4, dated May 12, 1981, the International priority of which is being claimed for the instant application, and which is hereby made part of this application. Any discrepancies between the foregoing specification and the aforementioned corresponding German application are to be resolved in favor of the latter.

We claim:

1. Method for doping semiconductor material, including a container into which doping material is led and aimed at the semiconductor material by means of an electrical field, which comprises placing a low-pressure plasma containing the doping material in a hydrogen-phosphine mixture in the container, maintaining the low-pressure plasma at a pressure of substantially $8 \times 10^{-4}$ torr, placing a high-frequency coil around the container, maintaining the frequency of the coil at substantially 4 MHz, and exciting the plasma to lead doping material ions into the semiconductor material by means of the electrical field.

2. Method according to claim 1, which comprises providing the plasma in the form of a capacitively coupled-in high-frequency plasma.

3. Method according to claim 1, which comprises providing the plasma in the form of an inductively excited high-frequency plasma.

4. Method according to claim 3, which comprises separately controlling the electromagnetic field for plasma generation and for forming a strain voltage for accelerating ions onto a target.

5. Method according to claim 1, which comprises generating the plasma in the form of a capacitively excited high-frequency plasma in a doping gas, accelerating the doping material ions onto a target on which the semiconductor material to be doped is provided, and providing the semiconductor material in the form of semiconductor substrates.

6. Method according to claim 1, which comprises generating the plasma in the form of an inductively excited high-frequency plasma in a doping gas, accelerating the doping material ions onto a target on which the semiconductor material to be doped is provided, and providing the semiconductor material in the form of semiconductor substrates.

7. Method according to claim 5, which comprises providing the doping gas from the group consisting of $PH_3$, $B_2H_6$ and phosphoric vapor, from an evaporator source.

8. Method according to claim 3, which comprises providing the tank in the form of a glass receptacle.

9. Method according to claim 3, which comprises providing the tank in the form of a glass receptacle, and exciting the plasma in the form of a ring discharge with the coil.

10. Method according to claim 8, which comprises applying a strain voltage of substantially 500 volts between a target and an anode for several seconds.

11. Method according to claim 1, which comprises maintaining a current density on a target of substantially 1 $mA/cm^2$.

12. Method according to claim 4, 5, 6 or 10, which comprises maintaining a current density on the target of substantially 1 $mA/cm^2$.

13. Method according to claim 12, which comprises slowly upwardly controlling the strain voltage to reduce the maximal doping level in the semiconductor material and to obtain an optimal output doping profile.

14. Method according to claim 1, which comprises curing the semiconductor material at substantially 950° C. for substantially 30 minutes, and forming the desired doping profile by diffusion.

15. Method according to claim 1, which comprises curing the semiconductor material by bombardment with a laser.

16. Method according to claim 1, which comprises curing the semiconductor material by bombardment with an electron beam.

* * * * *